United States Patent [19]
Möhl

[11] Patent Number: 4,992,665
[45] Date of Patent: Feb. 12, 1991

[54] FILAMENTLESS MAGNETRON-ION SOURCE AND A PROCESS USING IT

[75] Inventor: Wolfgang Möhl, Kirchheim, Fed. Rep. of Germany

[73] Assignee: Technics Plasma GmbH, Munich, Fed. Rep. of Germany

[21] Appl. No.: 377,841

[22] PCT Filed: Nov. 10, 1988

[86] PCT No.: PCT/EP88/01015
§ 371 Date: Jun. 26, 1989
§ 102(e) Date: Jun. 26, 1989

[87] PCT Pub. No.: WO89/04546
PCT Pub. Date: May 18, 1989

[30] Foreign Application Priority Data
Nov. 11, 1987 [DE] Fed. Rep. of Germany ....... 3738352

[51] Int. Cl.$^5$ .............................................. H01J 3/04
[52] U.S. Cl. ............................ 250/423 R; 315/111.81
[58] Field of Search ............... 250/423 R; 315/111.81, 315/111.41

[56] References Cited
U.S. PATENT DOCUMENTS

| | | | |
|---|---|---|---|
| 4,401,054 | 8/1983 | Matsuo et al. | 118/50.1 |
| 4,507,588 | 3/1985 | Asmussen | 315/111.81 |
| 4,630,566 | 12/1986 | Asmussen et al. | 315/111.81 |
| 4,691,662 | 9/1987 | Roppel et al. | 118/723 |
| 4,788,473 | 11/1988 | Mori et al. | 315/111.81 |
| 4,857,809 | 8/1989 | Torri et al. | 315/111.81 |

OTHER PUBLICATIONS

"The Experimental Test of a Microwave Ion Beam Source in Oxygen", Asmussen et al., *J. Vac. Sci. Tech. B*, vol. 5, No. 1, Jan. 1987, pp. 328–332.

*Primary Examiner*—Bruce C. Anderson
*Attorney, Agent, or Firm*—Kane, Dalsimer, Sullivan, Kurucz, Levy, Eisele & Richard

[57] ABSTRACT

The invention relates to a filamentless magnetron-ion source with a magnetron, a microwave guide or a microwave coaxial line, a cylindrical cavity resonator, a lambda-4-short circuit slider member, ECR magnets and a quartz dome. The invention also relates to a process using the said apparatus.

7 Claims, 3 Drawing Sheets

FILAMENTLESS MAGNETRON-ION SOURCE AND A PROCESS USING IT

The known electrostatic Kaufman ion source (US PS 3 156 090) provides for ion generation by electrostatic fields. For this purpose an electron emitter (thermionic cathode) and metallic electrodes are required in the plasma chamber. Contamination of the plasma by sputter products from the metallic electrodes is, however, undesirable.

Further developments, for example those of Sakudo et al., resulted in ion sources that operate without thermionic cathodes. Such ion sources are fitted with a 2.4 GHz magnetron, a waveguide, a short circuit slider member, DC magnets and extraction electrodes (US PS 4 058 748). It is difficult, however, to provide the ionization chamber with a vacuum-tight seal with respect to the magnetron. For this purpose discs consisting of a dielectric such as boron nitride have hitherto been proposed (US PS 4 058 748, 4 316 090, 4 393 333, 4 409 520). There is furthermore the disadvantage that the contact of the gas with the metallic waveguide results in the production of sputter products. As a result of the contamination of the gas, undesired implants or dopants may appear on the substrate.

In another known design, the substrate is treated directly in the ionization chamber on a substrate platform (US PS 4 438 368).

Compared with these known plasma ion sources a novel device is now disclosed that overcomes the above mentioned disadvantages in an elegant and simple manner and at the same time ensures an especially good yield of ions.

In accordance with the invention a filamentless magnetron-ion source is provided that comprises the following elements:
- a magnetron (119) for generating an electrical alternating field (2.4 GHz),
- a microwave guide (102) and/or a microwave coaxial line (105),
- a cylindrical cavity resonator (1; 101),
- a lambda/4-short circuit slider member (4; 104),
- ECR magnets (6; 106; 206) and
- a quartz dome (8; 108; 208) for the gas plasma to be generated.

The ions are generated in the magnetron-ion source of the invention by means of an electrode-free microwave gas discharge, which maintains itself, so that no electrode emitter (thermionic cathode) is required. Compared with an arrangement having a thermionic cathode and anode, the thermal load originating from the ion source and acting on the substrate or a material specimen is drastically reduced.

The ionization chamber is surrounded by a quartz dome, preferably in the shape of the cap of a sphere, which shields the ionizing gas from all of the components of the waveguide. The result of this is that a plasma completely free of sputter products is obtained in an elegant manner. This is particularly important since the gas obtained is preferably used for etching substrates. A plasma contaminated by impurities would result in the undesirable implantation of sputter products in the substrates.

Another advantageous feature of the ion source of the invention is the incorporation of a lambda/4-short circuit slider member. This provides an excellent sliding contact between the waveguide and the cylindrical cavity resonator and causes the resonator to oscillate in optimum manner. In this manner impedance and frequency are fixed and the desired degree of ionization is produced.

As regards the other components, the skilled person can retain those of the ion sources already described in the literature.

The microwave energy (2.4 GHz) produced in a magnetron (microwave generator) is coupled into a tuned cylindrical resonator either by way of a waveguide or a coaxial line, as desired, with the aid of a lambda/4-short circuit slider member. By varying its length in the axial direction, the cylindrical cavity resonator may have its resonant frequency matched to the magnetron frequency. A gas, for example argon, flows into the ionization chamber surrounded by the quartz dome and, for the ionization, the gas is acted upon by an electric alternating field. The gas can be introduced by way of an annular gas inlet system.

In one embodiment, the ionized gas is drawn off in the form of directed ion beams by way of a multi-aperture electrode extraction system, and directed onto the material to be etched, which is arranged in an adjacent vacuum chamber. The extraction system may consist of two or three successive graphite electrodes. Graphite is the preferred material since it is inert and also, with the passage of time, causes no deposits on the surface of the quartz dome. The electrodes are perforated in such a manner that the individual beams emerging through the apertures overlap to form one broad beam.

Another variant of the ion beam system is an ECR plasma stream source (ECR=electron-cyclotron-resonance). In this case, instead of the electrostatic extraction grid system an orifice is provided, the diameter of which is optimized for the mode of use. The field gradient of the ECR magnetic field allows an electrically neutral plasma stream to be produced, which escapes through the orifice.

The ion beam system according to the invention is suitable in an especially advantageous manner for processes for etching substrates. ECR plasma stream sources have optimum properties for low-energy anisotropic etching. The resulting plasma stream does not require neutralization.

The apparatus according to the invention is explained in detail with reference to the drawings, each of which shows a preferred embodiment.

Figure 1:
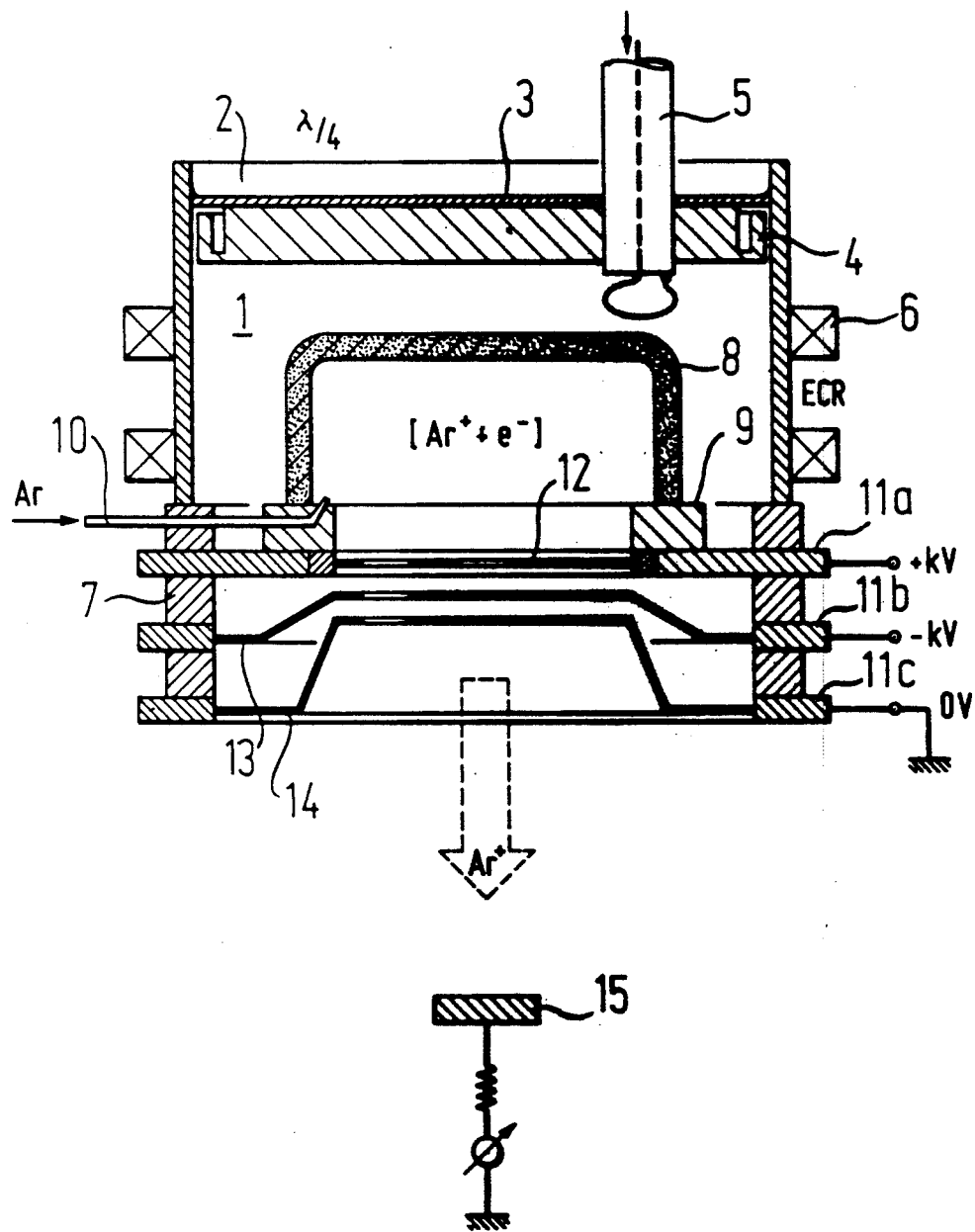
FIG. 1 shows a schematic sectional view of an embodiment of the ion source according to the invention.

In the embodiment of the filamentless magnetron-ion source shown in FIG. 1, microwaves of a frequency of 2.4 GHz are generated by a magnetron or microwave generator (not shown). The microwaves generated can be guided, as desired, by a microwave guide section 2 or by a microwave coaxial line 5 into a cavity resonator 1, which in the embodiment according to FIG. 1 is in the shape of a short cylinder. In the embodiment illustrated, the cavity resonator 1 is closed by a base 3 through which the coaxial line 5 passes. In the embodiment illustrated the microwaves are introduced coaxially, so that the iris of the waveguide 2 must be imagined to be closed. The base 3 carries a slider member 4 including a lambda/4 (quarter wave) short circuit or choke and can be displaced in the direction of the quartz dome 8 or in the opposite direction. The cavity resonator 1 is supported by an approximately cylindrical pedestal 7 into which enter, at three different levels, insulators 11a, 11b and 11c. These insulators 11a, 11b and 11c can be of any shape, for example disc-shaped or ring-shaped. In the embodiment illustrated, the insulator 11a adjacent to the quartz dome is an perforated disc, the internal diameter of which is distinctly smaller than that of the cavity resonator 1, and the insulator 11a in turn carries an annular support 9 of the same internal diameter on which the quartz dome 8 is seated. The tubular gas supply 10 is passed through the pedestal 7 and the quartz dome support 9 so that the supplied gas, for example argon, enters through a nozzle into the quartz dome 8. The insulators 11a, 11b and 11c carry multiaperture extraction electrodes 12, 13 and 14, preferably made of graphite. As can be seen from FIG. 1, the electrodes 12, 13 and 14 are "screened off" to prevent material being deposited on the insulators. In the embodiment shown, the apertures of the electrodes are aligned with each other in such a manner that a broad beam made up of individual overlapping beams of the plasma results. The potentials of the individual electrodes can be seen in FIG. 1. The support 15 for the substrate to be exposed to the plasma beam is earthed and is illustrated only schematically. ECR indicates magnet coils that surround the cavity resonator 1.

Figure 2:
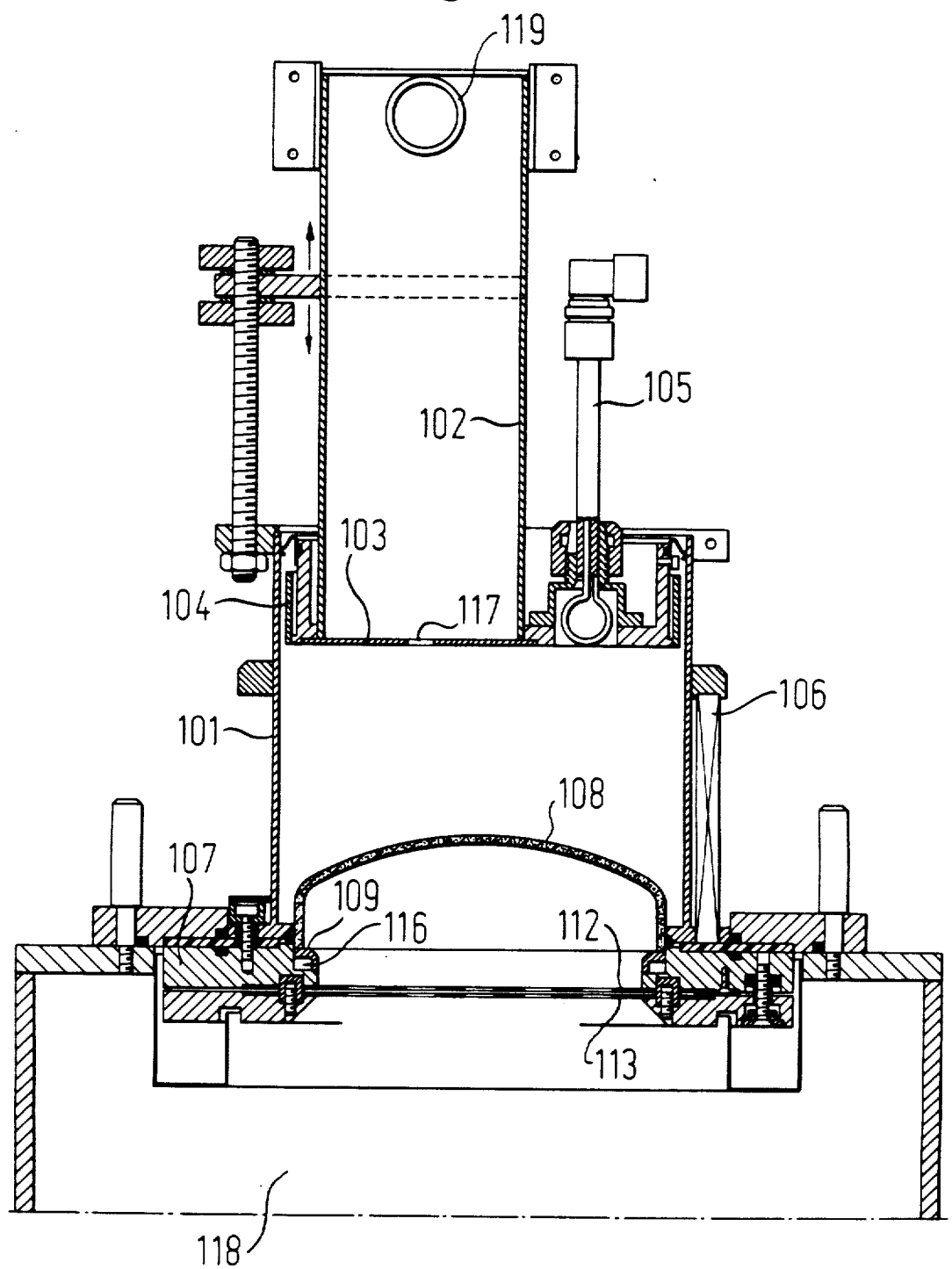
FIG. 2 shows another embodiment of the ion source according to the invention partially in cross section.

According to FIG. 2, the microwaves generated by a magnetron 119 are introduced by means of a waveguide 102 into the cavity resonator 101 by way of an iris 117 provided in the base 103 of the waveguide 102. Optionally a coaxial line 105 is also provided. The base 103 carries at its periphery a lambda/4-short circuit slider member 104. The waveguide 102 together with coaxial line 105 is suspended on a threaded rod so that its level is adjustable, and in the upper region of the cavity resonator 101 it may be joined to the resonator 101 by way of a spring-like metallic sliding contact.

In this embodiment the quartz dome 108 is seated on an annular support 109, which together with the pedestal 107 forms an annular channel through which the gas is introduced into the quartz dome by way of apertures (not shown).

In the embodiment shown, unlike the embodiment in FIG. 1 only two multiaperture extraction electrodes 112, 113 are provided.

The ECR magnets 106 are shown only schematically. The reactor 118 for the action of the plasma on the given substrate is cut off in the lower region.

Figure 3:
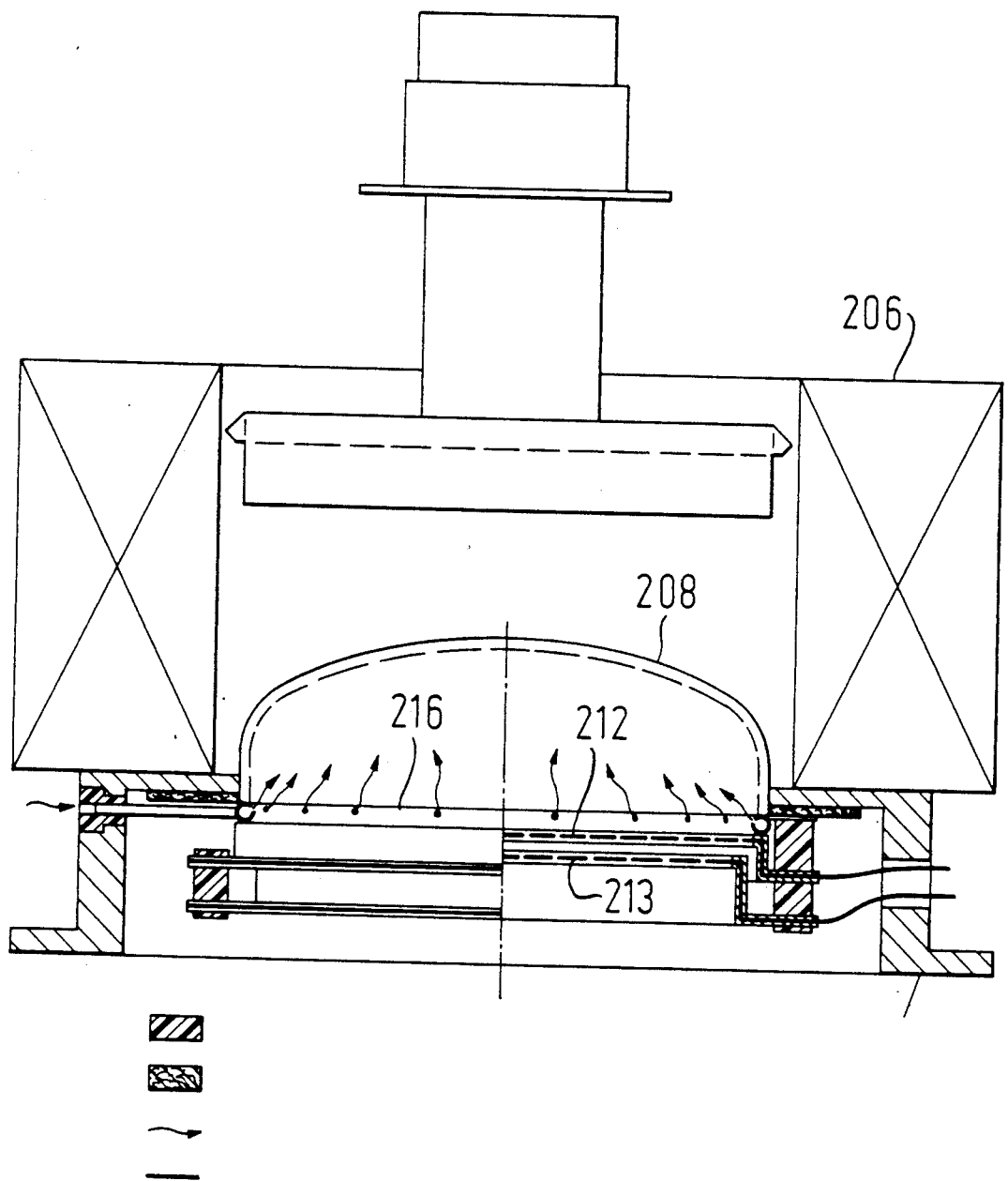
FIG. 3 shows another embodiment of the invention partially in section.
Figure 3:
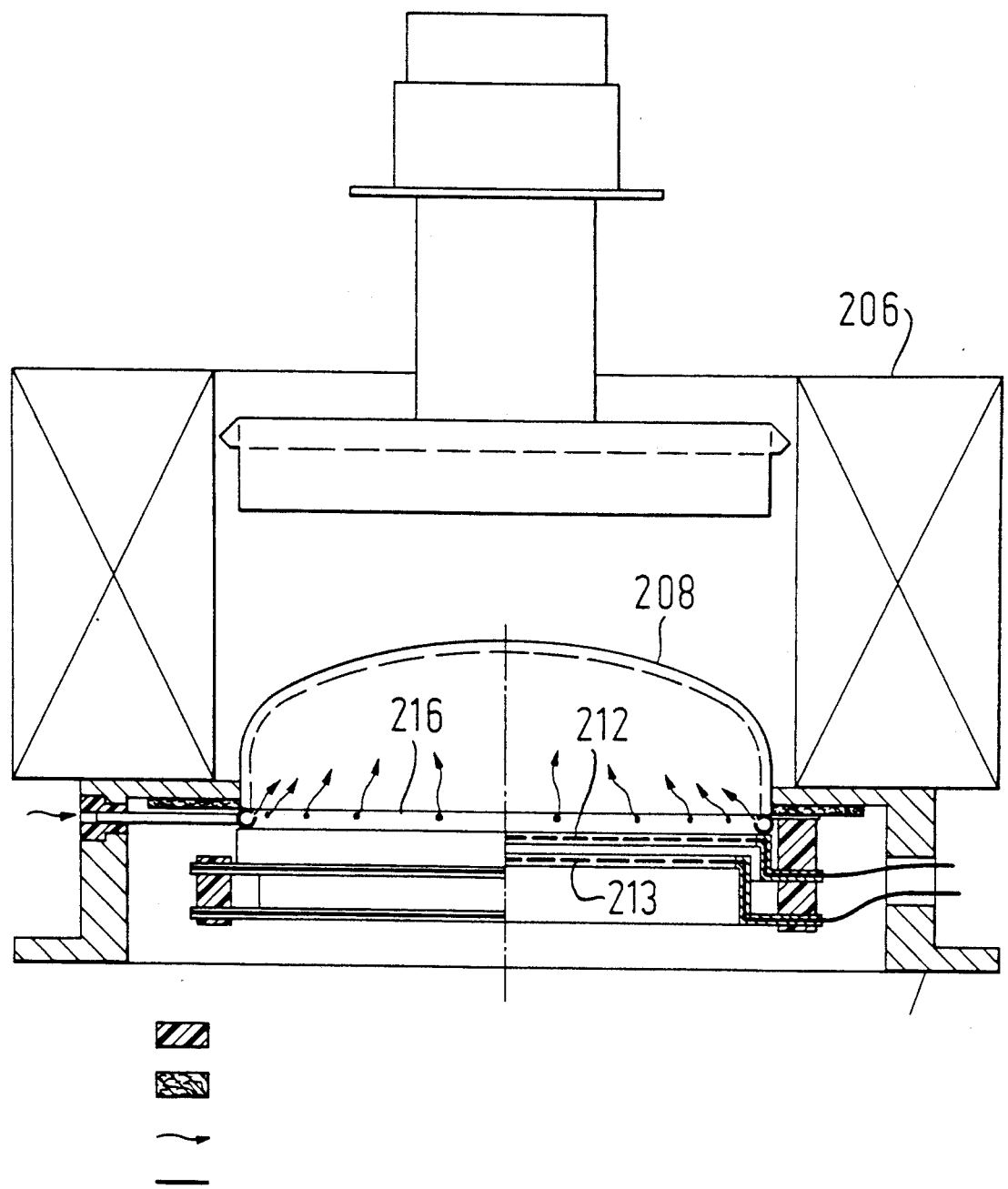

In the embodiment shown in FIG. 3, the quartz dome 208 is again supplied with gas by way of an annular line 216. As in the embodiment of FIG. 2, a pair of electrodes 212, 213 are provided.

I claim:

1. A filamentless magnetron-ion source comprising:
   a magnetron (119) for generating microwaves;
   a cylindrical cavity resonator (1, 101) with an input iris:
   microwave guide means arrange and constructed for coupling said microwaves to said iris;
   a sliding member with a quarter-wave choke disposed in said resonator for matching the performance of said resonator to said magnetron:
   gas inlet means for providing a gas into said resonator;
   a quartz dome disposed in said resonator for forming an ionization chamber and for shielding said gas from gas components from said microwave guide means;
   ECR magnet means for ionizing said gas into ions; and
   ion extracting means for extracting said plasma from said dome.

2. A filamentless magnetron-ion source according to claim 1, characterized in that it comprises, in addition:
   a multi-aperture passage for extracting one or more directed ion beams and
   a vacuum chamber for the ion beams to act on material specimens.

3. A filamentless magnetron-ion source according to claim 2, characterized in that the multi-aperture passage is formed from several extraction electrodes arranged one after the other (12, 13 and 14; 112 and 113; 212 and 213).

4. A filamentless magnetron-ion source according to claim 2, characterized in that, furthermore, it comprises:
   an annular gas inlet system (116; 216) opening into the quartz dome.

5. A filamentless magnetron-ion source according to claim 1, characterized in that it comprises, in addition,:
   an orifice through which the plasma passes, the diameter of which is made optimum for the mode of use, and
   a vacuum chamber for the ion beams to act on material specimens.

6. A filamentless magnetron-ion source according to claim 5, characterized in that it furthermore comprises.
   an annular gas inlet system opening into the quartz dome.

7. A filamentless magnetron-ion source according to claim 1, comprising in addition:
   a microwave coaxial line for coupling said microwaves to said cylindrical cavity resonator.

* * * * *

UNITED STATES PATENT AND TRADEMARK OFFICE
CERTIFICATE OF CORRECTION

Page 1 of 2

PATENT NO. : 4,992,665
DATED : February 12, 1991
INVENTOR(S) : Wolfgang Mohl It is certified that error appears in the above-identified patent and that said Letters Patent is hereby corrected as shown below:

In the Drawings

At the top of Figure 1 it reads "Sheet 1 of 2" - this should read -- Sheet 1 of 3 -- .

Sheet 2 of 3, consisting of Fig. 3, should be deleted and substitute sheet 2 of 3 consisting of Fig. 2 as shown on the attached page.

Signed and Sealed this

Thirteenth Day of October, 1992

*Attest:*

DOUGLAS B. COMER

*Attesting Officer*     *Acting Commissioner of Patents and Trademarks*